United States Patent
Ishii et al.

(10) Patent No.: US 7,452,655 B2
(45) Date of Patent: Nov. 18, 2008

(54) ACRYLIC COPOLYMER AND RADIATION-SENSITIVE RESIN COMPOSITION

(75) Inventors: Hiroyuki Ishii, Tokyo (JP); Kouichi Fujiwara, Tokyo (JP); Hiroshi Yamaguchi, Tokyo (JP); Yukio Nishimura, Tokyo (JP)

(73) Assignee: JSR Corporation, Tokyo (JP)

( * ) Notice: Subject to any disclaimer, the term of this patent is extended or adjusted under 35 U.S.C. 154(b) by 380 days.

(21) Appl. No.: 10/533,254

(22) PCT Filed: Nov. 4, 2003

(86) PCT No.: PCT/JP03/14051

§ 371 (c)(1),
(2), (4) Date: Oct. 25, 2005

(87) PCT Pub. No.: WO2004/041879

PCT Pub. Date: May 21, 2004

(65) Prior Publication Data

US 2006/0074139 A1 Apr. 6, 2006

(30) Foreign Application Priority Data

Nov. 5, 2002 (JP) ............ 2002-320697
Nov. 14, 2002 (JP) ............ 2002-330870

(51) Int. Cl.
*G03F 7/00* (2006.01)
*G03F 7/004* (2006.01)

(52) U.S. Cl. ................. 430/270.1; 526/282

(58) Field of Classification Search ........... 430/270.1; 526/282
See application file for complete search history.

(56) References Cited

U.S. PATENT DOCUMENTS

| 6,403,280 | B1 | 6/2002 | Yamahara et al. |
| 6,482,568 | B1 | 11/2002 | Douki et al. |
| 6,800,419 | B2 | 10/2004 | Soyano et al. |
| 6,933,094 | B2 | 8/2005 | Miyaji et al. |
| 7,179,578 | B2 | 2/2007 | Sato et al. ............ 430/270.1 |
| 2003/0054286 | A1 | 3/2003 | Sato et al. ............ 430/270.1 |
| 2003/0203309 | A1 | 10/2003 | Nishimura et al. |
| 2004/0048192 | A1 | 3/2004 | Shima et al. |
| 2004/0146802 | A1 | 7/2004 | Yamamoto et al. |
| 2005/0214680 | A1 | 9/2005 | Miyaji et al. |

FOREIGN PATENT DOCUMENTS

| EP | 1353225 A2 * | 10/2003 |
| EP | 1500977 A1 * | 1/2005 |
| JP | 05-188598 | 7/1993 |
| JP | 06-012452 | 1/1994 |
| JP | 09-073173 | 3/1997 |
| JP | 2000-026446 | 1/2000 |
| JP | 2002-145955 | 5/2002 |
| JP | 2002-156750 | 5/2002 |
| JP | 2002-201232 | 7/2002 |
| JP | 2002-251013 | 9/2002 |
| JP | 2002-303978 | 10/2002 |
| JP | 2002-372784 | 12/2002 |
| JP | 2003-043690 | 2/2003 |
| JP | 2003-206315 | 7/2003 |

OTHER PUBLICATIONS

U.S. Appl. No. 10/533,223, filed Apr. 29, 2005, Nishimura et al.

* cited by examiner

*Primary Examiner*—Amanda C. Walke
(74) *Attorney, Agent, or Firm*—Morris, Manning & Martin, LLP; Christopher W. Raimund

(57) ABSTRACT

An acrylic copolymer having a specific structure and a radiation-sensitive resin composition comprising the acrylic copolymer having high transparency to radiation, excelling in basic properties as a resist such as sensitivity, resolution, dry etching resistance, and pattern shape, and, in particular, excelling in forming contact holes and lines-and-spaces.

12 Claims, No Drawings

ACRYLIC COPOLYMER AND RADIATION-SENSITIVE RESIN COMPOSITION

TECHNICAL FIELD

The present invention relates to an acrylic copolymer and a radiation-sensitive resin composition, and particularly to a radiation-sensitive resin composition suitable as a chemically-amplified resist useful for microfabrication utilizing various types of radiation, for example, deep ultraviolet rays such as a KrF excimer laser or ArF excimer laser, X-rays such as synchrotron radiation, or charged particle rays such as electron beams.

BACKGROUND ART

In the field of microfabrication represented by the manufacture of integrated circuit devices, lithographic technology enabling microfabrication with a line width of about 200 nm or less using an ArF excimer laser (wavelength: 193 nm), $F_2$ excimer laser (wavelength: 157 nm), and the like has been demanded in order to achieve higher integration in recent years. As a radiation-sensitive resin composition applicable to the excimer laser radiation, a number of chemically-amplified radiation-sensitive compositions utilizing a chemical amplification effect between a component having an acid-labile functional group and an acid generator, a component generating an acid upon irradiation, have been proposed.

As polymers that can be used for a radiation-sensitive resin composition, a (meth)acrylate polymer having a lactone structure (Japanese Patent No. 3042618 (Claims)), a compound having an alicyclic group with a specific structure, in which one of the carbon atoms forming the ring skeleton has a deprotecting group having a moiety substituted by a suitable lower alkyl group or in which the ring skeleton has a deprotecting group bonding by an ester bond via at least one atom other than the carbon atom (Japanese Patent Application Laid-open No. 9-73173 ([0137])), a chemically-amplified positive-tone resist composition comprising a resin possessing alkali-solubility protected by a 2-alkyl-2-adamantyl group or 1-adamantane-1-alkyladamantyl group, being insoluble or scarcely soluble in alkali by itself, but becoming alkali-soluble by the action of an acid, and a specific sulfonium salt acid generator (Japanese Patent Application Laid-open No. 2002-156750 ([0008])), a polymer for photo resist prepared by ternary copolymerization of a specific substrate-adhesive alicyclic ester, an acid-labile ester having a specific alicyclic skeleton, and, as a third component, a specific alicyclic ester having a polarity between the above first component and the second component (Japanese Patent Application Laid-open No. 2002-145955 ([0008] and [0009])), a resin which contains three types of monomer units of specific structures having an alicyclic skeleton at a specific rate (Japanese Patent Application Laid-open No. 2002-201232 ([0009] and [0010])), and the like have been known.

However, to achieve a higher degree of integration in the field of semiconductor, a radiation-sensitive resin composition used as a resist is required to possess more excellent resolution. To promote resolution and to produce more accurate pattern configuration, radiation-sensitive resin compositions with a variety of combinations are used. For example, different radiation-sensitive resin compositions are used for forming contact holes and for line-and-spaces. There may be a case where only one radiation-sensitive resin composition is used in order to shrink manufacturing process steps. A thermal flow technique to decrease contact hole pattern size by post baking after development is used to form contact holes with a small dimension. However, there are no radiation-sensitive resin composition using ArF excimer laser (wavelength: 193 nm), $F_2$ excimer laser (wavelength: 157 nm), enabling microfabrication with a line width of about 200 nm or less using with thermal flow technique. Slight roughness produced during etching operation adversely affects resolution as the contact holes become small and lines-and-spaces become narrow.

DISCLOSURE OF THE INVENTION

The present invention has been achieved in view of this situation. Specifically, an object of the present invention is to provide an acrylic copolymer having a specific structure and a radiation-sensitive resin composition comprising an acrylic copolymer having high transparency to radiation, excelling in basic properties as a resist such as sensitivity, resolution, dry etching resistance, and pattern shape, and, in particular, excelling in forming contact holes and lines-and-spaces.

The acrylic copolymer of the present invention comprises the recurring units shown by the following formulas (1), (2), and (3).

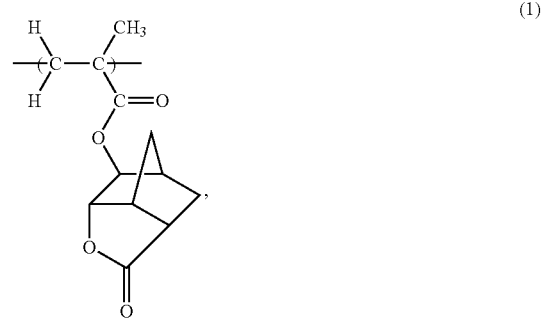

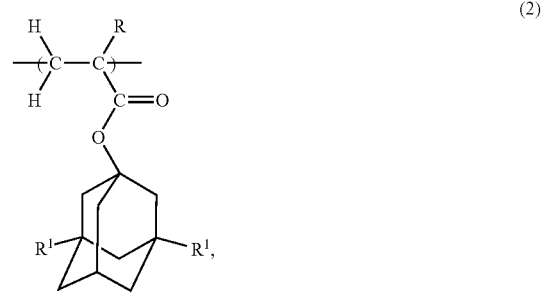

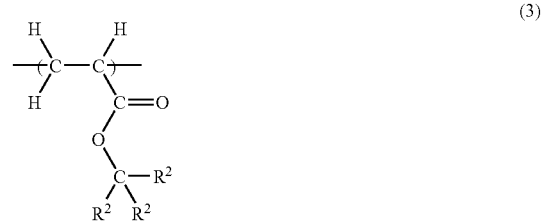

In the formula (2), R represents a hydrogen atom or a methyl group; $R^1$ individually represents a hydrogen atom, hydroxyl group, or —$COOR^3$ group, wherein $R^3$ is a hydrogen atom, a linear or branched alkyl group having 1-4 carbon atoms or an alicyclic alkyl group having 3-20 carbon atoms, provided that at least one of the $R^1$ groups is not a hydrogen atom. In the formula (3), $R^2$ individually represents a monovalent alicyclic hydrocarbon group having 4-20 carbon atoms or a derivative thereof, or a linear or branched alkyl group having 1-4 carbon atoms, at least one of $R^2$ groups is a monovalent alicyclic hydrocarbon group having 4-20 carbon atoms or a derivative thereof, or any two of the $R^2$ groups form, in combination and together with the carbon atom to which the two $R^2$ groups bond, a divalent alicyclic hydrocarbon group having 4-20 carbon atoms or a derivative thereof, with the remaining $R^2$ being a linear or branched alkyl group having 1-4 carbon atoms or a monovalent alicyclic hydrocarbon group having 4-20 carbon atoms or a derivative thereof.

The radiation-sensitive resin composition of the present invention comprises an acid-labile group-containing resin which is insoluble or scarcely soluble in alkali, but becomes alkali soluble by the action of an acid and a photoacid generator, wherein the acid-labile group-containing resin is an acrylic copolymer comprising recurring units of the above formulas (1), (2), and (3).

Steps of forming lines-and-spaces and contact holes are typical lithography processes in the lithographic technology requiring microfabrication. As the requirement for microfabrication increases, the lines-and-spaces and contact holes cannot be necessarily processed using the same radiation-sensitive resin composition. When resolution performance as a resist is pursued, the configuration of the hole pattern is important in regard to the lines-and-spaces, whereas the configuration in the upper portion of the pattern is important in regard to the contact holes. As a result of extensive studies to solve this problem, the inventors of the present invention have found that if a radiation-sensitive resin composition contains both a methacrylic recurring unit and an acrylic recurring unit, the resin composition can produce excellent patterns in the formation of lines-and-spaces and contact holes and can provide a wide process margin. In addition, the inventors have found that the resin composition exhibits excellent heat treatment temperature dependency after exposure process by selecting a —$C(R^2)_3$ group on a specific functional side chain as a recurring unit (3), thereby providing a solution to the problem of heat treatment temperature dependency when miniaturization requirements further increase. The present invention has been achieved based on these findings.

The radiation-sensitive resin composition of the present invention in which an acrylic copolymer is used, not only has superior basic properties as a chemically-amplified resist sensitive to active radiations, particularly to deep ultraviolet rays represented by an ArF excimer laser (wavelength: 193 nm) such as high transmittance of radiations, excellent resolution, and high sensitivity, and superior pattern configuration, but also, in the first place, has extremely high etching resistance and minute surface roughness after etching and, in the second place, can adjust the contact hole size during post baking. In addition, the radiation-sensitive resin composition can reduce the line width fluctuation due to post baking temperature variations.

BEST MODE FOR CARRYING OUT THE INVENTION

As the monomer providing the recurring unit represented by the formula (1) which forms the polymer main chain, methacrylic acid esters shown by the formula (1-1) can be given.

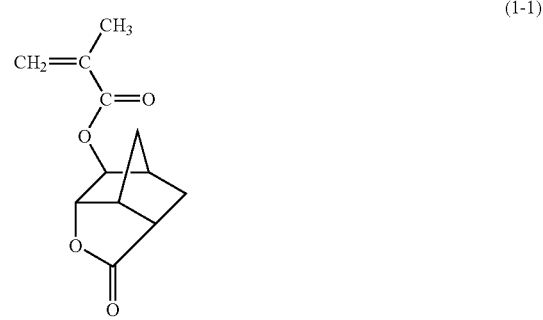

(1-1)

In the formula (2), R represents a hydrogen atom or a methyl group, and $R^1$ individually represents a hydrogen atom, a hydroxyl group, or a —$COOR^3$ group, provided that at least one $R^1$ group is not a hydrogen atom. In addition, at least one $R^1$ group is preferably a hydroxyl group.

$R^3$ in the —$COOR^3$ group represents a hydrogen atom, a linear or branched alkyl group having 1-4 carbon atoms, or an alicyclic alkyl group having 3-20 carbon atoms.

As examples of the linear or branched alkyl group having 1-4 carbon atoms, a methyl group, ethyl group, n-propyl group, i-propyl group, n-butyl group, 2-methylpropyl group, 1-methylpropyl group, and t-butyl group can be given.

As examples of the alicyclic alkyl group having 3-20 carbon atoms, a cycloalkyl group represented by —$C_nH_{2n-1}$ (wherein n is an integer of 3-20) such as a cyclopropyl group, cyclobutyl group, cyclopentyl group, cyclohexyl group, cycloheptyl group, and cyclooctyl group, polycyclic alkyl group such as a bicyclo[2.2.1]heptyl group, tricyclo[5.2.1.0$^{2,6}$]decyl group, tetracyclo[6.2.1.1$^{3,6}$.0$^{2,7}$]dodecanyl group, an adamantyl group, a group in which the cycloalkyl group or polycyclic alkyl group is substituted with one or more linear, branched, or cyclic alkyl groups, and the like can be given.

The following compounds can be given as preferable examples of monomers providing the recurring unit of the formula (2) which forms the polymer main chain:
3-hydroxyadamantan-1-yl (meth)acrylate, 3,5-dihydroxyadamantan-1-yl (meth)acrylate,
3-hydroxy-5-carboxyadamantan-1-yl (meth)acrylate,
3-hydroxy-5-methoxycarbonyladamantan-1-yl (meth)acrylate,
3-carboxyadamantan-1-yl (meth)acrylate, 3,5-dicarboxyadamantan-1-yl (meth)acrylate,
3-carboxyl-5-hydroxyadamantan-1-yl (meth)acrylate,
3-carboxyl-5-methoxycarbonyladamantan-1-yl (meth)acrylate,
3-methoxycarbonyladamantan-1-yl (meth)acrylate,
3,5-dimethoxycarbonyladamantan-1-yl (meth)acrylate,
3-methoxycarbonyl-5-hydroxyadamantan-1-yl (meth)acrylate,
3-methoxycarbonyl-5-carboxyadamantan-1-yl (meth)acrylate, and the like.

As particularly preferable monomers providing the recurring unit of the formula (2) which forms the polymer main chain, 3-hydroxyadamantan-1-yl (meth)acrylate, 3,5-dihydroxyadamantan-1-yl (meth)acrylate, 3-carboxyadamantan-1-yl (meth)acrylate, 3,5-dicarboxy-adamantan-1-yl (meth)acrylate, 3-carboxyl-5-hydroxyadamantan-1-yl (meth)acrylate, 3-methoxycarbonyl-5-hydroxyadamantan-1-yl (meth)acrylate, and the like can be given.

In the formula (3), as the monovalent alicyclic hydrocarbon group having 4-20 carbon atoms or a derivative thereof represented by $R^2$, or as the divalent alicyclic hydrocarbon group having 4-20 carbon atoms represented by at least one of the $R^2$ groups or formed by two $R^2$ groups together with the carbon atoms to which the two $R^2$ groups bond or a derivative thereof, alicyclic groups derived from cycloalkanes such as bicyclo[2.2.1]heptane, tricyclo[5.2.1.0$^{2,6}$]decane, tetracyclo[6.2.1.1$^{3,6}$.0$^{2,7}$]dodecane, cyclobutane, cyclopentane, and cyclohexane; groups in which the alicyclic groups are replaced with at least one linear, branched, or cyclic alkyl group having 1-4 carbon atoms such as a methyl group, ethyl group, n-propyl group, i-propyl group, n-butyl group, 2-methylpropyl group, 1-methylpropyl group, and t-butyl group; and the like can be given.

As examples of the derivatives of the monovalent or divalent alicyclic hydrocarbon groups represented by $R^2$, groups having one or more substituents such as a hydroxyl group; a carboxyl group; an oxy group (=O); a hydroxyalkyl group having 1-4 carbon atoms such as a hydroxymethyl group, 1-hydroxyethyl group, 2-hydroxyethyl group, 1-hydroxypropyl group, 2-hydroxypropyl group, 3-hydroxypropyl group, 2-hydroxybutyl group, 3-hydroxybutyl group, and 4-hydroxybutyl group; an alkoxyl group having 1-4 carbon atoms such as a methoxy group, ethoxy group, n-propoxy group, i-propoxy group, n-butoxy group, 2-methylpropoxy group, 1-methylpropoxy group, and t-butoxy group; a cyano group; a cyanoalkyl group having 2-5 carbon atoms such as a cyanomethyl group, 2-cyanoethyl group, 3-cyanopropyl group, and 4-cyanobutyl group; and the like can be given.

Of these substituents, a hydroxyl group, carboxyl group, hydroxymethyl group, cyano group, cyanomethyl group, and the like are preferable.

As examples of the linear or branched alkyl group having 1-4 carbon atoms represented by $R^2$, a methyl group, ethyl group, n-propyl group, i-propyl group, n-butyl group, 2-methylpropyl group, 1-methylpropyl group, and t-butyl group can be given. Of these, a methyl group, ethyl group, n-propyl group, and i-propyl group are preferable.

As preferable examples of the divalent alicyclic hydrocarbon group having 4-20 carbon atoms formed by two $R^2$ groups which bond together with the carbon atom to which the two $R^2$ groups bond or a derivative thereof, groups shown by the following formulas (3-1) to (3-4) can be given. In the formulas, $R^2$ bonds to the same carbon atom which forms the alicyclic hydrocarbon group or a derivative thereof, wherein the carbon atom bonds to oxygen in the main chain or side chain, and q and r are integers from 0 to 2.

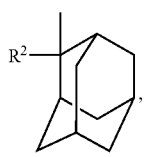
(3-1)

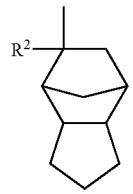
(3-2)

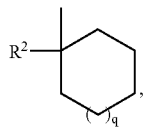
(3-3)

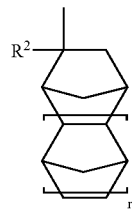
(3-4)

As preferable examples of the skeleton when at least one $R^2$ forms the monovalent alicyclic hydrocarbon group having 4-20 carbon atoms, groups shown by the following formulas (3-5) to (3-8) can be given. q and r are integers from 0 to 2.

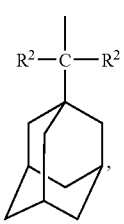
(3-5)

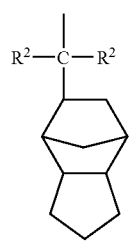
(3-6)

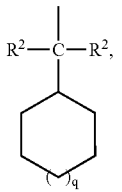

(3-7)

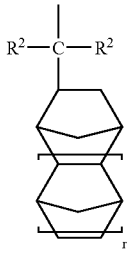

(3-8)

As examples of the monovalent functional group side chain formed by R², the following groups can be given. Note that the following examples are —C(R²)₃ bonded to the oxygen atom of the ester group.

1-methyl-1-cyclopentyl group, 1-ethyl-1-cyclopentyl group, 1-n-propyl-1-cyclopentyl group, 1-i-propyl-1-cyclopentyl group, 1-methyl-1-cyclohexyl group,
1-ethyl-1-cyclohexyl group, 1-n-propyl-1-cyclohexyl group, 1-i-propyl-1-cyclohexyl group, 2-methyladamantan-2-yl group, 2-methyl-3-hydroxyadamantan-2-yl group,
2-ethyladamantan-2-yl group, 2-ethyl-3-hydroxyadamantan-2-yl group,
2-n-propyladamantan-2-yl group, 2-n-propyl-3-hydroxyamantan-2-yl group,
2-isopropyladamantan-2-yl group, 2-isopropyl-3-hydroxyadamantan-2-yl group,
2-methylbicyclo[2.2.1]hept-2-yl group, 2-ethylbicyclo[2.2.1]hept-2-yl group,
8-methyltricyclo[5.2.1.0²,⁶]dec-8-yl group, 8-ethyltricyclo[5.2.1.0²,⁶]dec-8-yl group,
4-methyl-tetracyclo[6.2.1.1³,⁶.0²,⁷]dodec-4-yl group,
4-ethyl-tetracyclo[6.2.1.1³,⁶.0²,⁷]dodec-4-yl group,
1-(bicyclo[2.2.1]hept-2-yl)-1-methylethyl group,
1-(tricyclo[5.2.1.0²,⁶]dec-8-yl)-1-methylethyl group,
1-(tetracyclo[6.2.1.1³,⁶.0²,⁷]dec-4-yl)-1-methylethyl group,
1-(adamantan-1-yl)-1-methylethyl group, 1-(3-hydroxyadamantan-1-yl)-1-methylethyl group, 1,1-dicyclohexylethyl group, 1,1-di(bicyclo[2.2.1]hept-2-yl)ethyl group,
1,1-di(tricyclo[5.2.1.0²,⁶]dec-8-yl)ethyl group,
1,1-di(tetracyclo[6.2.1.1³,⁶.0²,⁷]dodec-4-yl)ethyl group, 1,1-di(adamantan-1-yl)ethyl group, and the like can be given.

As particularly preferable functional group side chains formed by —C(R²)₃ among the above groups, 1-methylcyclopentyl group, 1-ethyl-1-cyclopentyl group,
1-methyl-1-cyclohexyl group, and 1-ethyl-1-cyclohexyl group can be given.

The following compounds can be given as preferable examples of monomers providing the recurring unit of the formula (3) which forms polymer main chain:

1-methyl-1-cyclopentyl acrylate, 1-ethyl-1-cyclopentyl acrylate,
1-n-propyl-1-cyclopentyl acrylate, 1-i-propyl-1-cyclopentyl acrylate,
1-methyl-1-cyclohexyl acrylate, 1-ethyl-1-cyclohexyl acrylate,
1-n-propyl-1-cyclohexyl acrylate, 1-i-propyl-1-cyclohexyl acrylate,
2-methyladamantan-2-yl acrylate, 2-methyl-3-hydroxyadamantan-2-yl acrylate,
2-ethyladamantan-2-yl acrylate, 2-ethyl-3-hydroxyadamantan-2-yl acrylate,
2-n-propyladamantan-2-yl acrylate, 2-n-propyl-3-hydroxyadamantan-2-yl acrylate,
2-isopropyladamantan-2-yl acrylate, 2-isopropyl-3-hydroxyadamantan-2-yl acrylate,
2-methyladamantan-2-yl acrylate, 2-methylbicyclo[2.2.1]hept-2-yl acrylate,
2-ethylbicyclo[2.2.1]hept-2-yl acrylate, 8-methyltricyclo[5.2.1.0²,⁶]dec-8-yl acrylate,
8-ethyltricyclo[5.2.1.0²,⁶]dec-8-yl acrylate,
4-methyltetracyclo[6.2.1.1³,⁶.0²,⁷]dodec-4-yl acrylate,
4-ethyltetracyclo[6.2.1.1³,⁶.0²,⁷]dodec-4-yl acrylate,
1-(bicyclo[2.2.1]hept-2-yl)-1-methyl acrylate, 1-(tricyclo[5.2.1.0²,⁶]dec-8-yl)-1-methyl acrylate, 1-(tetracyclo[6.2.1.1³,⁶.0²,⁷]dodec-4-yl)-1-methylethyl acrylate,
1-(adamantan-1-yl)-1-methylethyl acrylate,
1-(3-hydroxyadamantan-1-yl)-1-methylethyl acrylate, 1,1-dicyclohexylethyl acrylate,
1,1-di(bicyclo[2.2.1]hept-2-yl)ethyl acrylate, 1,1-di(tricyclo[5.2.1.0²,⁶]dec-8-yl)ethyl acrylate, 1,1-di(tetracyclo[6.2.1.1³,⁶.0²,⁷]dodec-4-yl)ethyl acrylate,
1,1-di(adamantan-1-yl)ethyl acrylate, and the like.

As particularly preferable monomers providing the recurring unit of the formula (3) which forms the polymer main chain, 1-methyl-1-cyclopentyl acrylate,
1-ethyl-1-cyclopentyl acrylate, 1-n-propyl-1-cyclopentyl acrylate,
1-methyl-1-cyclohexyl acrylate, 1-ethyl-1-cyclohexyl acrylate, and the like can be given. These monomers may be used either individually or in combination of two or more.

The acrylic copolymer of the present invention may comprise recurring units other than the recurring units (1), (2), and (3). As examples of the monomer providing such other recurring unit, for example, unsaturated amides such as (meth)acrylamide, N,N-dimethyl(meth)acrylamide, crotonamide, maleinamide, fumaramide, mesaconamide, citraconamide, and itaconamide; polyfunctional monomers such as methylene glycol di(meth)acrylate, ethylene glycol di(meth)acrylate, propylene glycol di(meth)acrylate, 2,5-dimethyl-2,5-hexanediol di(meth)acrylate, 1,2-adamantandiol di(meth)acrylate, 1,3-adamantandiol di(meth)acrylate, 1,4-adamantan dioldi(meth)acrylate, tricyclodecanyl dimethylol di(meth)acrylate, and the like can be given.

The acrylic copolymer of the present invention is preferably formed from the recurring unit (1), recurring unit (2), and recurring unit (3) at a molar ratio (mol % of the total recurring units) of 20-70:5-40:20-50, and preferably 30-60:5-25:30-45.

If the content of the recurring unit (1) is less than 20 mol %, the resist tends to exhibit poor developability; if more than 70 mol %, resolution of the resist and solubility in a resist solvent tend to be impaired.

If the content of the recurring unit (2) is less than 5 mol %, resolution of the resist tends to be impaired; if more than 40 mol %, the resist tends to exhibit poor developability.

If the content of the recurring unit (3) is less than 20 mol %, resolution tends to be impaired; if more than 50 mol %, the resist tends to exhibit poor developability.

The acrylic copolymer of the present invention can be prepared by polymerizing a mixture of monomers corresponding to each of the above recurring units in an appropriate solvent in the presence of a radical polymerization initiator such as hydroperoxide, dialkyl peroxide, diacyl peroxide, or azo compound, as required, using a chain transfer agent.

As examples of the solvent which can be used for the polymerization, cycloalkanes such as cyclohexane, cycloheptane, cyclooctane, decalin, norbomane; saturated carboxylic acid esters such as ethyl acetate, n-butyl acetate, i-butyl acetate, methyl propionate, and propylene glycol monomethyl ether acetate; alkyllactones such as γ-butyrolactone; alkylketones such as 2-butanone, 2-heptanone, and methyl isobutyl ketone; cycloalkylketones such as cyclohexanone; alcohols such as 2-propanol and propylene glycol monomethyl ether; and the like can be given.

These solvents may be used either individually or in combination of two or more.

The polymerization temperature is usually 40-120° C., and preferably 50-100° C. The reaction time is usually 1-48 hours, and preferably 1-24 hours.

It is preferable that not only the acrylic copolymer of the present invention is almost free from impurities such as halogen and metals, but also the content of residual monomers and oligomers should be less than the prescribed amount, for example, 0.1 wt % or less when measured by HPLC. This not only further improves sensitivity, resolution, process stability, pattern configuration, and the like as a resist, but also enables provision of a resist having no foreign particle in the solution and showing no change in sensitivity over time.

As examples of the purification method for the acrylic copolymer, the following methods can be given. As a method for removing impurities such as metals, a method of adsorbing metals in the resin solution using a zeta-potential filter, a method of transforming the metals into a chelate state by washing the resin solution with an acidic aqueous solution such as oxalic acid or sulfonic acid and removing the metals, and the like can be given. As a method for removing the residual monomers and oligomer components at a specific value or less, a liquid-liquid extraction method in which the residual monomers and oligomer components are removed by combining washing with water and a suitable solvent, a purification method in a liquid state such as ultrafiltration in which only the monomers and oligomer components having a specific molecular weight or less are extracted and removed, a reprecipitation method in which the residual monomers and the like are removed by adding the acrylic copolymer solution to a poor solvent dropwise, thereby causing the polymer solution to coagulate in the poor solvent, and a purification method in a solid state in which the polymer slurry separated by filtration is washed with a poor solvent can be given. These methods may be used in combination. The type of the poor solvent used in the reprecipitation method varies depending on the properties of the acrylic copolymer to be purified and the like. Such a poor solvent is therefore appropriately selected.

The polystyrene-reduced weight average molecular weight (hereinafter referred to as "Mw") of the acrylic copolymer determined by gel permeation chromatography (GPC) is usually 1,000-300,000, preferably 2,000-200,000, and still more preferably 3,000-100,000. If the Mw of the acrylic copolymer is less than 1,000, heat resistance as a resist may be decreased. If the Mw exceeds 300,000, developability as a resist may be decreased.

The ratio of Mw to the polystyrene-reduced number average molecular weight (hereinafter referred to as "Mn") determined by gel permeation chromatography (GPC) (Mw/Mn) of the acrylic copolymer is usually 1-5, and preferably 1-3.

The Mw and Mn were measured in the present invention by gel permeation chromatography (GPC) using GPC columns (manufactured by Tosoh Corp., G2000$H_{XL}$×2, G3000$H_{XL}$×1,
G4000$H_{XL}$×1) under the following conditions. Flow rate: 1.0 ml/min., eluate: tetrahydrofuran, column temperature: 40° C., standard reference material: monodispersed polystyrene.

In the present invention, the acrylic copolymer can be used either individually or in combination of two or more.

The acrylic copolymer is usually insoluble or scarcely soluble in alkali, but becomes alkali-soluble by the action of an acid. Therefore, the copolymer can be suitably used as an acid-labile group-containing resin in a radiation-sensitive resin composition.

A radiation-sensitive resin composition can be obtained by combining the acrylic copolymer as an acid-labile group-containing resin and an acid generator which generates an acid by being irradiated with radiation.

As the acid generator, onium salt compounds such as sulfonium salt and iodonium salt, organo halide compounds, sulfone compounds such as disulfones and diazomethane sulfones, and the like can be given.

As preferable examples of the acid generator, triphenylsulfonium salt compounds such as triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, triphenylsulfonium 2-(3-tetracyclo[4.4.0.1$^{2,5}$.1$^{7,10}$]dodecanyl)-1,1-difluoroethanesulfonate,
triphenylsulfonium N,N'-bis(nonafluoro-n-butanesulfonyl)imidate, and
triphenylsulfoniumcamphorsulfonate;
4-cyclohexylphenyldiphenylsulfonium salt compounds such as
4-cyclohexylphenyldiphenylsulfonium trifluoromethanesulfonate,
4-cyclohexylphenyldiphenylsulfonium nonafluoro-n-butanesulfonate,
4-cyclohexylphenyldiphenylsulfonium perfluoro-n-octanesulfonate,
4-cyclohexylphenyldiphenylsulfonium 2-bicyclo[2.2.1]hept-2-yl-1,1,2,2-tetrafluoroethanesulfonate,
4-cyclohexylphenyldiphenylsulfonium 2-(3-tetracyclo[4.4.0.1$^{2,5}$.1$^{7,10}$]dodecanyl)-1,1-difluoroethanesulfonate,
4-cyclohexylphenyldiphenylsulfonium N,N'-bis(nonafluoro-n-butanesulfonyl)imidate,
and 4-cyclohexylphenyldiphenylsulfonium camphorsulfonate;
4-t-butylphenyldiphenylsulfonium salt compounds such as
4-t-butylphenyldiphenylsulfonium trifluoromethanesulfonate,
4-t-butylphenyldiphenylsulfonium nonafluoro-n-butanesulfonate,
4-t-butylphenyldiphenylsulfonium perfluoro-n-octanesulfonate,
4-t-butylphenyldiphenylsulfonium 2-bicyclo[2.2.1]hept-2-yl-1,1,2,2-tetrafluoroethanesulfonate,
4-t-butylphenyldiphenylsulfonium 2-(3-tetracyclo[4.4.0.1$^{2,5}$.1$^{7,10}$]dodecanyl)-1,1-difluoroethanesulfonate,
4-t-butylphenyldiphenylsulfonium N,N'-bis(nonafluoro-n-butanesulfonyl)imidate, and
4-t-butylphenyldiphenylsulfonium camphorsulfonate;
tri(4-t-butylphenyl)sulfonium salt compounds such as tri(4-t-butylphenyl)sulfonium trifluoromethanesulfonate, tri(4-t-butylphenyl)sulfonium nonafluoro-n-butanesulfonate, tri(4-t-butylphenyl)sulfonium perfluoro-n-octanesulfonate,
tri(4-t-butylphenyl)sulfonium 2-bicyclo[2.2.1]hept-2-yl-1,1,2,2-tetrafluoroethanesulfonate,
tri(4-t-butylphenyl)sulfonium 2-(3-tetracyclo[4.4.0.1$^{2,5}$.1$^{7,10}$]dodecanyl)-1,1-difluoroethanesulfonate,
tri(4-t-butylphenyl)sulfonium N,N'-bis(nonafluoro-n-butanesulfonyl)imidate, and
tri(4-t-butylphenyl)sulfonium camphorsulfonate;
diphenyliodonium salt compounds such as diphenyliodonium trifluoromethanesulfonate,
diphenyliodonium nonafluoro-n-butanesulfonate, diphenyliodonium
perfluoro-n-octanesulfonate, diphenyliodonium 2-bicyclo[2.2.1]hept-2-yl-1,1,2,2-tetrafluoroethanesulfonate, diphenyliodonium
2-(3-tetracyclo[4.4.0.1$^{2,5}$.1$^{7,10}$]dodecanyl)-1,1-difluoroethanesulfonate,
diphenyliodonium N,N'-bis(nonafluoro-n-butanesulfonyl) imidate, and
diphenyliodonium camphorsulfonate;
bis(4-t-butylphenyl)iodonium salt compounds such as bis(4-t-butylphenyl)iodonium
trifluoromethanesulfonate, bis(4-t-butylphenyl)iodonium nonafluoro-n-butanesulfonate,
bis(4-t-butylphenyl)iodonium perfluoro-n-octanesulfonate,
bis(4-t-butylphenyl)iodonium 2-bicyclo[2.2.1]hept-2-yl-1,1,2,2-tetrafluoroethanesulfonate,
bis(4-t-butylphenyl)iodonium 2-(3 tetracyclo[4.4.0.1$^{2,5}$.1$^{7,10}$]dodecanyl)-1,1-difluoroethanesulfonate,
bis(4-t-butylphenyl)iodonium N,N'-bis(nonafluoro-n-butanesulfonyl)imidate, and
bis(4-t-butylphenyl)iodonium camphorsulfonate;
1-(4-n-butoxynaphthalen-1-yl)tetrahydrothiophenium salt compounds such as
1-(4-n-butoxynaphthalen-1-yl)tetrahydrothiophenium trifluoromethanesulfonate,
1-(4-n-butoxynaphthalen-1-yl)tetrahydrothiophenium nonafluoro-n-butanesulfonate,
1-(4-n-butoxynaphthalen-1-yl)tetrahydrothiophenium perfluoro-n-octanesulfonate,
1-(4-n-butoxynaphthalen-1-yl)tetrahydrothiophenium 2-bicyclo[2.2.1]hept-2-yl-1,1,2,2-tetrafluoroethanesulfonate,
1-(4-n-butoxynaphthalen-1-yl)tetrahydrothiophenium 2-(3-tetracyclo[4.4.0.1$^{2,5}$.1$^{7,10}$]dodecanyl)-1,1-difluoroethanesulfonate,
1-(4-n-butoxynaphthalen-1-yl)tetrahydrothiophenium N,N'-bis(nonafluoro-n-butanesulfonyl)imidate, and
1-(4-n-butoxynaphthalen-1-yl)tetrahydrothiophenium camphorsulfonate;
1-(3,5-dimethyl-4-hydroxyphenyl)tetrahydrothiophenium salt compounds such as
1-(3,5-dimethyl-4-hydroxyphenyl)tetrahydrothiophenium trifluoromethanesulfonate,
1-(3,5-dimethyl-4-hydroxyphenyl)tetrahydrothiophenium nonafluoro-n-butanesulfonate,
1-(3,5-dimethyl-4-hydroxyphenyl)tetrahydrothiophenium perfluoro-n-octanesulfonate,
1-(3,5-dimethyl-4-hydroxyphenyl)tetrahydrothiophenium 2-bicyclo[2.2.1]hept-2-yl-1,1,2,2-tetrafluoroethanesulfonate,
1-(3,5-dimethyl-4-hydroxyphenyl)tetrahydrothiophenium 2-(3-tetracyclo[4.4.0.1$^{2,5}$.1$^{7,10}$]dodecanyl)-1,1-difluoroethanesulfonate,
1-(3,5-dimethyl-4-hydroxyphenyl)tetrahydrothiophenium N,N'-bis(nonafluoro-n-butanesulfonyl)imidate, and
1-(3,5-dimethyl-4-hydroxyphenyl)tetrahydrothiophenium camphorsulfonate;
succinimide compounds such as N-(trifluoromethanesulfonyloxy)succinimide,
N-(nonafluoro-n-butanesulfonyloxy)succinimide,
N-(perfluoro-n-octanesulfonyloxy)succinimide,
N-(2-bicyclo[2.2.1]hept-2-yl-1,1,2,2-tetrafluoroethanesulfonyloxy)succinimide,
N-(2-(3-tetracyclo[4.4.0.1$^{2,5}$.1$^{7,10}$]dodecanyl)-1,1-difluoroethanesulfonyloxy) succinimide, and N-(camphorsulfonyloxy)succinimide;
bicyclo[2.2.1]hept-5-ene-2,3-dicarboxyimides such as
N-(trifluoromethanesulfonyloxy)bicyclo[2.2.1]hept-5-ene-2,3-dicarboxyimide,
N-(nonafluoro-n-butanesulfonyloxy)bicyclo[2.2.1]hept-5-ene-2,3-dicarboxyimide,
N-(perfluoro-n-octanesulfonyloxy)bicyclo[2.2.1]hept-5-ene-2,3-dicarboxyimide,
N-(2-bicyclo[2.2.1]hept-2-yl-1,1,2,2-tetrafluoroethanesulfonyloxy)bicyclo[2.2.1]hept-5-ene-2,3-dicarboxyimide,
N-(2-(3-tetracyclo[4.4.0.1$^{2,5}$.1$^{7,10}$]dodecanyl)-1,1-difluoroethanesulfonyloxy)bicyclo [2.2.1]hept-5-ene-2,3-dicarboxyimide,
N-(camphorsulfonyloxy)bicyclo[2.2.1]hept-5-ene-2,3-dicarboxyimide, and the like can be given.

Among these compounds, triphenylsulfonium salt compounds, 4-cyclohexylphenyldiphenyl sulfonium salt compounds, 4-t-butylphenyldiphenyl sulfonium salt compounds, and tri(4-t-butylphenyl)sulfonium salt compounds are preferable.

In the present invention, the acid generators can be used either individually or in combination of two or more.

In order to ensure sensitivity and developability as a resist, the amount of acid generator to be used is usually 0.1-20 parts by weight, and preferably 0.1-7 parts by weight for 100 parts by weight of the acrylic copolymer. If the amount of the acid generator is less than 0.1 part by weight, sensitivity and developability may be decreased. If the amount exceeds 20 parts by weight, a rectangular resist pattern may not be obtained due to decreased transparency to radiation.

Various types of additives such as acid diffusion controllers, alicyclic additives having an acid-labile group, alicyclic additives having no acid-labile group, surfactants, and sensitizers may optionally be added to the radiation-sensitive resin composition of the present invention.

The acid diffusion controllers control diffusion of an acid generated from the acid generator upon irradiation to the resist film to suppress undesired chemical reactions in the non-irradiate area.

Addition of the acid diffusion controller further improves storage stability of the resulting radiation-sensitive resin composition and resolution of the resist. Moreover, the addition of the acid diffusion controller prevents the line width of the resist pattern from changing due to changes in the post-exposure delay (PED) between irradiation and development, whereby a composition with remarkably superior process stability can be obtained.

As the acid diffusion controller, nitrogen-containing organic compounds of which the basicity does not change during irradiation or heating when forming a resist pattern are preferable.

As examples of the nitrogen-containing organic compound, tertiary amine compounds, amide group-containing compounds, quaternary ammonium hydroxide compounds, and nitrogen-containing heterocyclic compounds can be given.

Examples of the tertiary amine compound include tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonyl amine, tri-n-decylamine, cyclohexyl dimethylamine, dicyclohexyl methylamine, and tricyclohexylamine; aromatic amines such as aniline, N-methylaniline, N,N-dimethylaniline, 2-methylaniline, 3-methylaniline, 4-methylaniline, 4-nitroaniline, 2,6-dimethylaniline, 2,6-diisopropylaniline, diphenylamine, triphenylamine, and naphthylamine; alkanolamines such as triethanolamine and diethanolaniline;
N,N,N',N'-tetramethylethylenediamine,
N,N,N',N'-tetrakis(2-hydroxypropyl)ethylenediamine,
1,3-bis[1-(4-aminophenyl)-1-methylethyl]benzene tetramethylenediamine,
2,2-bis(4-aminophenyl)propane, 2-(3-aminophenyl)-2-(4-aminophenyl)propane,
2-(4-aminophenyl)-2-(3-hydroxyphenyl)propane,
2-(4-aminophenyl)-2-(4-hydroxyphenyl)propane,
1,4-bis[1-(4-aminophenyl)-1-methylethyl]benzene,
1,3-bis[1-(4-aminophenyl)-1-methylethyl]benzene, bis(2-dimethylaminoethyl)ether,
bis(2-diethylaminoethyl)ether, and the like.

As examples of the amide group-containing compounds, N-t-butoxycarbonyl group-containing amino compounds such as N-t-butoxycarbonyl di-n-octylamine, N-t-butoxycarbonyl di-n-nonylamine, N-t-butoxycarbonyl di-n-decylamine, N-t-butoxycarbonyl dicyclohexylamine, N-t-butoxycarbonyl-1-adamantylamine,
N-t-butoxycarbonyl-N- methyl-1-adamantylamine,
N,N-di-t-butoxycarbonyl-1-adamantylamine,
N,N-di-t-butoxycarbonyl-N-methyl-1-adamantylamine,
N-t-butoxycarbonyl-4,4'-diaminodiphenylmethane,
N,N'-di-t-butoxycarbonylhexamethylenediamine,
N,N,N'N'-tetra-t-butoxycarbonylhexamethylenediamine,
N,N'-di-t-butoxycarbonyl-1,7-diaminoheptane,
N,N'-di-t-butoxycarbonyl-1,8-diaminooctane,
N,N'-di-t-butoxycarbonyl-1,9-diaminononane,
N,N'-di-t-butoxycarbonyl-1,10-diaminodecane,
N,N'-di-t-butoxycarbonyl-1,12-diaminododecane,
N,N'-di-t-butoxycarbonyl-4,4'-diaminodiphenylmethane,
N-t-butoxycarbonylbenzimidazole, N-t-butoxycarbonyl-2-methylbenzimidazole, and
N-t-butoxycarbonyl-2-phenylbenzimidazole; formamide, N-methylformamide,
N,N-dimethylformamide, acetamide, N-methylacetamide, N,N-dimethylacetamide, propionamide, benzamide, pyrrolidone, N-methylpyrrolidone, and the like can be given.

As examples of the quaternary ammonium hydroxide compound, tetramethylammonium hydroxide, tetraethylammonium hydroxide, tetra-n-propylammonium hydroxide, and tetra-n-butylammonium hydroxide can be given.

Examples of the nitrogen-containing heterocyclic compounds include: imidazoles such as imidazole, 4-methylimidazol, 1-benzyl-2-methylimidazole,
4-methyl-2-phenylimidazole, benzimidazole, and 2-phenylbenzimidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, and acridine; piperazines such as piperazine, 1-(2-hydroxyethyl)piperazine; and pyrazine, pyrazole, pyridazine, quinoxaline, purine, pyrrolidine, piperidine, 3-piperidino-1,2-propanediol, morpholine,
4-methylmorpholine, 1,4-dimethylpiperazine, and 1,4-diazabicyclo[2.2.2]octane.

Of these nitrogen-containing organic compounds, the tertiary amine compounds, amide group-containing compounds, and nitrogen-containing heterocyclic compounds are preferable. Among the amide group-containing organic compounds, N-t-butoxycarbonyl group-containing amino compounds are particularly preferable. Among the nitrogen-containing heterocyclic compounds, imidazoles are particularly preferable.

The acid diffusion controller may be used either individually or in combination of two or more. The amount of the acid diffusion controller to be added is usually 15 parts by weight or less, preferably 10 parts by weight or less, and still more preferably 0.001-5 parts by weight for 100 parts by weight of the acrylic copolymer. If the amount of the acid diffusion controller exceeds 15 parts by weight, sensitivity as a resist and developability of the irradiated area tend to decrease. If the amount is less than 0.001 part by weight, the pattern configuration or dimensional accuracy as a resist may decrease depending on the processing conditions.

The alicyclic additives having an acid-labile group and alicyclic additives having no acid-labile group improve dry etching resistance, pattern shape, and adhesion to the substrate.

As examples of such alicyclic additives, adamantane derivatives such as t-butyl 1-adamantanecarboxylate, t-butoxycarbonylmethyl 1-adamantanecarboxylate, α-butyrolactone 1-adamantanecarboxylate, di-t-butyl 1,3-adamantanedicarboxylate, t-butyl 1-adamantane acetate, t-butoxycarbonylmethyl 1-adamantan eacetate, di-t-butyl 1,3-adamantane diacetate, and 2,5-dimethyl-2,5-di(adamantylcarbonyloxy)hexane; deoxycholates such as t-butyl deoxycholate, t-butoxycarbonylmethyl deoxycholate,
2-ethoxyethyl deoxycholate, 2-cyclohexyloxyethyl deoxycholate, 3-oxocyclohexyl deoxycholate, tetrahydropyranyl deoxycholate, and mevalonolactone deoxycholate; lithocholates such as t-butyl lithocholate, t-butoxycarbonylmethyl lithocholate,
2-ethoxyethyl lithocholate, 2-cyclohexyloxyethyl lithocholate, 3-oxocyclohexyl lithocholate, tetrahydropyranyl lithocholate, and mevalonolactone lithocholate; alkyl carboxylates such as dimethyl adipate, diethyl adipate, dipropyl adipate, di-n-butyl adipate, and di-t-butyl adipate; and the like can be given.

These alicyclic additives may be used either individually or in combination of two or more. The amount of the alicyclic additives to be added is usually 50 parts by weight or less, and preferably 30 parts by weight or less for 100 parts by weight of the acrylic copolymer. If the amount of the alicyclic additives exceeds 50 parts by weight, heat resistance as a resist tends to decrease.

The surfactants improve applicability, striation, developability, and the like.

As examples of the surfactant, nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate; and commercially available products such as KP341 (manufactured by Shin-Etsu Chemical Co., Ltd.), POLYFLOW No. 75, No. 95 (manufactured by Kyoeisha Chemical Co., Ltd.), FTOP EF301, EF303, EF352 (manufactured by Tohkem Products Corporation), MEGAFAC F171, F173 (manufactured by Dainippon Ink and Chemicals, Inc.), Fluorad FC430, FC431 (manufactured by Sumitomo 3M Ltd.), Asahi Guard AG710, and Surflon S-382, SC-101, SC-102, SC-103, SC-104, SC-105, SC-106 (manufactured by Asahi Glass Co., Ltd.) can be given.

The surfactants may be used either individually or in combination of two or more. The amount of surfactants to be added is usually two parts by weight or less for 100 parts by weight of the acrylic copolymer.

The sensitizers absorb radiation energy and transmit the energy to the acid generator, thereby increasing the amount of an acid generated upon exposure. The sensitizers improve apparent sensitivity of the radiation-sensitive resin composition.

As examples of sensitizers, carbazoles, benzophenones, rose bengals, anthracenes, and phenols can be given.

These sensitizers may be used either individually or in combinations of two or more. The amount of sensitizers to be added is usually 50 parts by weight or less for 100 parts by weight of the acrylic copolymer.

As examples of other additives, halation inhibitors, adhesion promoters, storage stabilizers, anti-foaming agents, and the like can be given.

The radiation-sensitive resin composition of the present invention is made into a composition solution by dissolving the acrylic copolymer, acid generator, and the like in a solvent so that the total solid content is usually 3-50 wt %, and preferably 5-25 wt %, and filtering the solution using a filter with a pore diameter of about 200 nm, for example.

As examples of solvents used for preparation of the composition solution, linear or branched ketones such as 2-pentanone, 2-hexanone, 2-heptanone, and
2-octanone; cyclic ketones such as cyclopentanone and cyclohexanone; propylene glycol monoalkyl ether acetates such as propylene glycol monomethyl ether acetate and propylene glycol monoethyl ether acetate; alkyl 2-hydroxypropionate such as methyl 2-hydroxypropionate and ethyl 2-hydroxypropionate; alkyl 3-alkoxypropionates such as methyl 3-methoxypropionate, ethyl 3-methoxypropionate, methyl 3-ethoxypropionate, and ethyl 3-ethoxypropionate; ethylene glycol monomethyl ether, ethylene glycol monoethyl ether, diethylene glycol dimethyl ether, diethylene glycol diethyl ether, ethylene glycol monomethyl ether acetate, ethylene glycol monoethyl ether acetate, propylene glycol monomethyl ether, propylene glycol monoethyl ether, n-butyl acetate, methyl pyruvate, ethyl pyruvate, N-methyl pyrrolidone, γ-butyrolactone, and the like can be given.

Although these solvents may be used either individually or in combination of two or more, inclusion of at least one of the solvents selected from the group consisting of propylene glycol monomethyl ether acetate, 2-heptanone, cyclohexanone, γ-butyrolactone, ethyl 2-hydroxypropionate, and ethyl 3-ethoxypropionate is preferable.

The radiation-sensitive resin composition of the present invention is particularly useful as a chemically-amplified resist. The resin composition is particularly useful as a resist for forming contact holes.

In the chemically-amplified resist, an acid-labile group in the resin dissociates by the action of an acid generated from the acid generator upon irradiation, thereby producing a carboxyl group. As a result, solubility of the irradiated part of the resist in an alkaline developer increases, whereby the irradiated part is dissolved in an alkaline developer and removed to obtain a positive-tone resist pattern.

A resist pattern is formed from the radiation-sensitive resin composition of the present invention by applying the composition solution to, for example, substrates such as a silicon wafer and a wafer coated with aluminum using an appropriate application method such as spin coating, cast coating, and roll coating to form a resist film. The resist film is then optionally pre-baked (hereinafter called "PB") and irradiated with radiation to form a predetermined resist pattern. As the radiation, ultraviolet rays, deep ultraviolet rays such as KrF excimer laser (wavelength: 248 nm), ArF excimer laser (wavelength: 193 nm), $F_2$ excimer laser (wavelength: 157 nm), and EUV (extreme ultraviolet rays, wavelength: 13 nm, etc.), charged particle rays such as electron beams, X-rays such as synchrotron radiation, or the like may be appropriately used. Of these, deep ultraviolet rays and electron beams are preferable. The irradiation conditions such as radiation dosage are appropriately determined depending on the composition of the radiation-sensitive resin composition, types of additives, and the like.

It is preferable to perform post exposure bake (hereinafter called "PEB") in order to stably form a highly-accurate minute pattern. PEB ensures smooth dissociation of the acid-labile organic group in the resin (A). The heating temperature for the PEB is usually 30-200° C., and preferably 50-170° C., although the heating conditions vary depending on the composition of the radiation-sensitive resin composition.

It is possible to reduce the size of contact hole patterns at an excellent precision using the radiation-sensitive resin composition of the present invention by post exposure baking (PEB) and post development baking.

In order to bring out maximum potentiality of the radiation-sensitive resin composition of the present invention, an organic or inorganic anti-reflection film may be formed on a substrate as disclosed in Japanese Patent Publication No. 1994-12452, for example. Moreover, a protection film may be formed on the resist film as disclosed in Japanese Patent Application Laid-open No. 1993-188598, for example, in order to prevent the effects of basic impurities and the like in an environmental atmosphere. These techniques may be employed in combination.

The irradiated resist film is then developed using an alkaline developer to form a predetermined resist pattern.

An alkaline aqueous solution in which tetramethylammonium hydroxide is dissolved, for example, is preferable as the developer used for development.

The concentration of the alkaline aqueous solution is usually 10 wt % or less. If the concentration of the alkaline aqueous solution exceeds 10 wt %, a non-irradiated area may also be dissolved in the developer.

An appropriate amount of surfactant or the like may be added to the alkaline aqueous solution. The resist film is generally washed with water after development using the alkaline aqueous solution and dried.

EXAMPLE 1

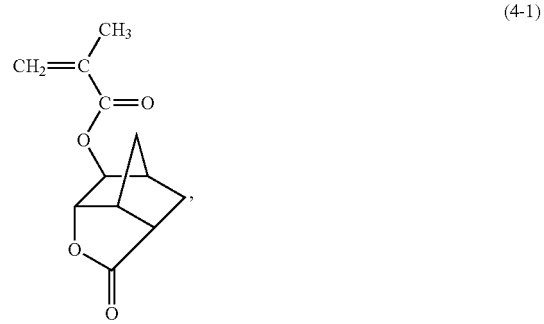

(4-1)

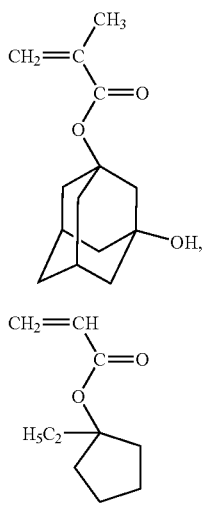

(4-2)

(4-3)

A monomer solution was prepared by dissolving 55.00 g (50 mol %) of compound (4-1), 11.70 g (10 mol %) of compound (4-2), and 33.31 g (40 mol %) of compound (4-3) in 200 g of 2-butanone, and further adding 4.56 g of dimethyl azobisisobutyrate. A 1000 ml three-necked flask was charged with 100 g of 2-butanone and nitrogen gas was purged into the flask for 30 minutes. After nitrogen purge, the flask was heated to 80° C. while stirring and the above monomer solution was added dropwise using a dropping funnel over four hours. The polymerization reaction was carried out for six hours after initiation of dropping. After completion of polymerization, the polymer solution was cooled with water to 30° C. or lower and poured into 2,000 g of a 1:2 mixed solvent of 2-propanol and n-heptane. White precipitate produced was collected by filtration. The white powder collected by filtration was washed twice with 400 g of a 1:2 mixed solvent of 2-propanol and n-heptane in a slurry state, filtered again, and dried for 17 hours at 50° C. to obtain a polymer in the form of white powder (72 g, yield 72%). The polymer was a copolymer with a Mw of 8,500 and a ratio of the recurring units of the compound (4-1), the compound (4-2), and the compound (4-3) determined by $^{13}$C NMR of 53.7:11.1:35.2 (mol %). This copolymer is referred to as "acrylic copolymer (A-1)".

EXAMPLE 2

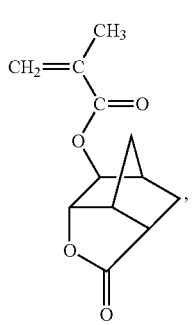

(5-1)

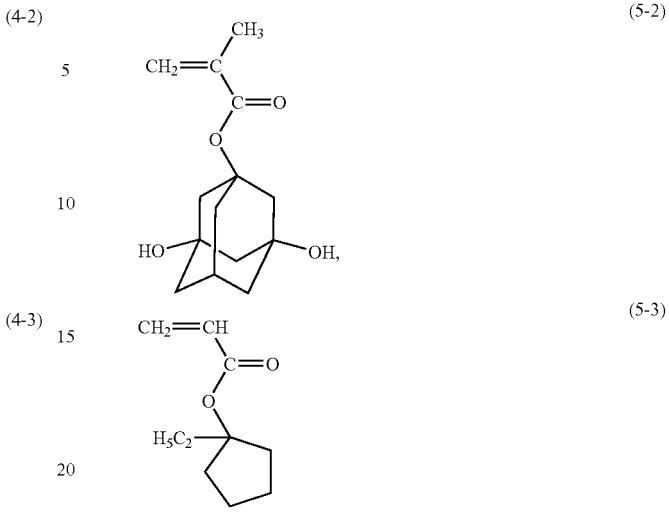

(5-2)

(5-3)

A monomer solution was prepared by dissolving 54.57 g (50 mol %) of compound (5-1), 12.39 g (10 mol %) of compound (5-2), and 33.04 g (40 mol %) of compound (5-3) in 200 g of 2-butanone, and further adding 4.52 g of dimethyl azobisisobutyrate. A 1000 ml three-necked flask was charged with 100 g of 2-butanone and nitrogen gas was purged into the flask for 30 minutes. After nitrogen purge, the flask was heated to 80° C. while stirring and the above monomer solution was added dropwise using a dropping funnel over four hours. The polymerization reaction was carried out for six hours after initiation of dropping. After completion of polymerization, the polymer solution was cooled with water to 30° C. or lower and poured into 2,000 g of a 1:2 mixed solvent of 2-propanol and n-heptane. White precipitate produced was collected by filtration. The white powder collected by filtration was washed twice with 400 g of a 1:2 mixed solvent of 2-propanol and n-heptane in a slurry state, filtered again, and dried for 17 hours at 50° C. to obtain a polymer in the form of white powder (69 g, yield 69%). The polymer was a copolymer with a Mw of 8,900 and a ratio of the recurring units of the compound (5-1), the compound (5-2), and the compound (5-3) determined by $^{13}$C NMR of 53.3:10.8: 35.9 (mol %). This copolymer is referred to as "acrylic copolymer (A-2)".

EXAMPLE 3

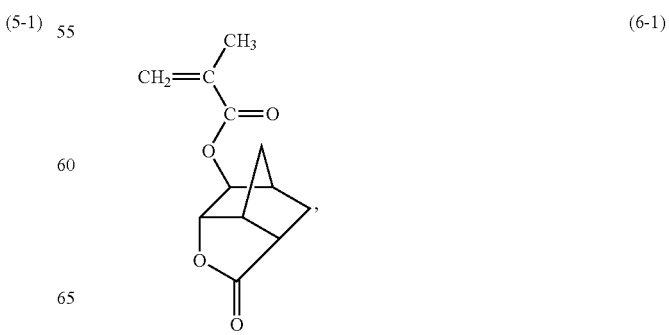

(6-1)

-continued (6-2)

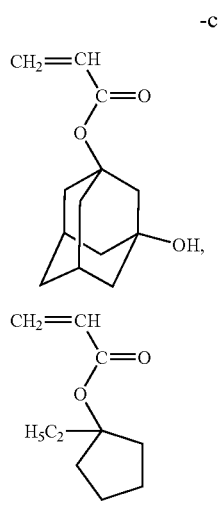

(6-3)

A monomer solution was prepared by dissolving 55.38 g (50 mol %) of compound (6-1), 11.08 g (10 mol %) of compound (6-2), and 33.54 g (40 mol %) of compound (6-3) in 200 g of 2-butanone, and further adding 4.59 g of dimethyl azobisisobutyrate. A 1000 ml three-necked flask was charged with 100 g of
2-butanone and nitrogen gas was purged into the flask for 30 minutes. After nitrogen purge, the flask was heated to 80° C. while stirring and the above monomer solution was added dropwise using a dropping funnel over four hours. The polymerization reaction was carried out for six hours after initiation of dropping. After completion of polymerization, the polymer solution was cooled with water to 30° C. or lower and poured into 2,000 g of a 1:2 mixed solvent of
2-propanol and n-heptane. White precipitate produced was collected by filtration. The white powder collected by filtration was washed twice with 400 g of a 1:2 mixed solvent of 2-propanol and n-heptane in a slurry state, filtered again, and dried for 17 hours at 50° C. to obtain a polymer in the form of white powder (65 g, yield 65%). The polymer was a copolymer with a Mw of 8200 and a ratio of the recurring units of the compound (6-1), the compound (6-2), and the compound (6-3) determined by $^{13}$C NMR of 53.6:11.0: 35.4 (mol %). This copolymer is referred to as "acrylic copolymer (A-3)".

COMPARATIVE EXAMPLE 1

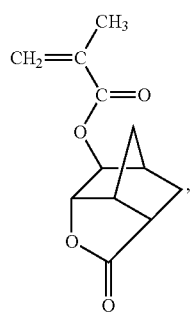

(7-1)

-continued

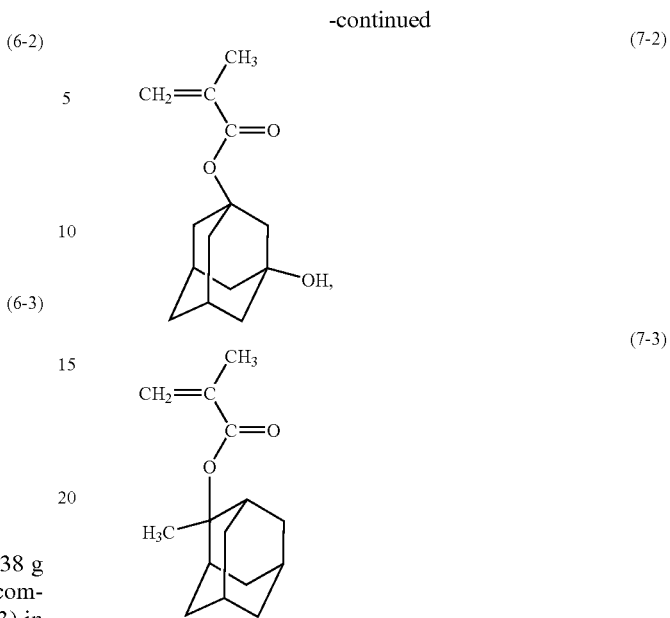

A monomer solution was prepared by dissolving 23.97 g (25 mol %) of compound (7-1), 50.55 g (50 mol %) of compound (7-2), and 25.49 g (25 mol %) of compound (7-3) in 200 g of 2-butanone, and further adding 3.97 g of dimethyl azobisisobutyrate. A 1000 ml three-necked flask was charged with 100 g of 2-butanone and nitrogen gas was purged into the flask for 30 minutes. After nitrogen purge, the flask was heated to 80° C. while stirring and the above monomer solution was added dropwise using a dropping funnel over three hours. The polymerization reaction was carried out for five hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried for 17 hours at 50° C. to obtain a polymer in the form of white resin powder (74 g, yield 74%). The polymer was a copolymer with a Mw of 9800 and a ratio of the recurring units of the compound (7-1), the compound (7-2), and the compound (7-3) determined by $^{13}$C NMR of 29.2:45.2:25.6 (mol %). This copolymer is referred to as "methacrylic copolymer (A-4)".

EXAMPLES 4-10 AND COMPARATIVE EXAMPLES 2-3

Radiation-sensitive resin composition solutions were prepared by mixing polymers obtained in Examples 1-3 and Comparative Example 1, acid generators described below, and other components in proportions shown in Table 1. The resulting radiation-sensitive resin composition solutions were evaluated. The evaluation results are shown in Table 2.

Acid Generator (B)
(B-1): Triphenylsulfonium nonafluoro-n-butanesulfonate
(B-2): Triphenylsulfonium
2-bicyclo[2.2.1]hept-2-yl-1,1,2,2-tetrafluoroethanesulfonate Acid Diffusion Controller (C)
(C-1): Triethanolamine
(C-2): 2-Phenylbenzimidazole
(C-3): 2,6-Diisopropylaniline Solvent (D)

(D-1): Propylene glycol monomethyl ether acetate (D-2): Cyclohexanone (D-3): γ-Butyrolactone Evaluation Method (1) Sensitivity 1

When irradiating the compositions of Examples 4-6 and Comparative Example 2 with light from an ArF light source, the composition solutions were applied to a silicon wafer (ARC29) with an ARC29 film (manufactured by Brewer Science Corp.) having a thickness of 78 nm by spin coating and pre-baked on a hot plate under the conditions shown in Table 2 to obtain a resist film with a thickness of 340 nm. The film was exposed to ArF excimer laser through a mask pattern using an ArF excimer laser exposure apparatus (manufactured by Nikon Corp., lens numerical aperture: 0.55). After performing PEB under the conditions shown in Table 2, the resist film was developed at 25° C. for 60 seconds in a 2.38 wt % tetramethylammonium hydroxide aqueous solution, washed with water, and dried to form a positive-tone resist pattern. An optimum dose at which a line-and-space (1L1S) pattern with a line width of 160 nm was formed was taken as "sensitivity 1".

(2) Resolution 1

The minimum line and space (1L1S) dimension resolved by an optimum dose of irradiation was taken as the "resolution 1".

(3) Sensitivity 2

When irradiating the compositions of Examples 4-6 and Comparative Example 2 with light from an ArF light source, the composition solutions were applied to a silicon wafer (ARC29) with an ARC29 film (manufactured by Brewer Science Corp.) having a thickness of 78 nm by spin coating and pre-baked on a hot plate under the conditions shown in Table 2 to obtain a resist coating with a thickness of 340 nm. The coating was exposed to ArF excimer laser through a mask pattern (a 6% half-tone mask was used) using an ArF excimer laser exposure apparatus (manufactured by Nikon Corp., lens numerical aperture: 0.55). After performing PEB under the conditions shown in Table 2, the resist film was developed at 25° C. for 60 seconds in a 2.38 wt % tetramethylammonium hydroxide aqueous solution, washed with water, and dried to form a positive-tone resist pattern. An optimum dose at which a contact hole pattern (1HIS) with a diameter of 200 nm was formed to a contact hole pattern with a diameter of 160 nm (mask bias: −40 nm) was taken as "sensitivity 2".

(4) Resolution 2

The minimum contact hole pattern dimension resolved by an optimum does of irradiation was taken as the "resolution 2".

(5) Sensitivity 3

In Examples 7-10 and Comparative Example 3, the composition solution was applied to a wafer substrate, on which an ARC29A film with a thickness of 77 nm (manufactured by Nissan Chemical Industries, Ltd.) had been formed, by spin coating and pre-baked on a hot plate under the conditions shown in Table 2 to obtain a resist coating with a thickness of 200 nm. The coating was exposed to light through a mask pattern (a 6% half-tone mask) using a full field reduced projection exposure apparatus (S306C, manufactured by Nikon Corp., lens numerical aperture: 0.75). After performing PEB under the conditions shown in Table 2, the resist film was developed at 25° C. for 40 seconds in a 2.38 wt % tetramethylammonium hydroxide aqueous solution, washed with water, and dried to form a positive-tone resist pattern. An optimum dose at which a hole pattern formed through a mask pattern with a hole size of mask diameter of 120 nm and a mask pitch of 220 nm has a hole pattern diameter of 100 nm was taken as "sensitivity 3".

(6) Sensitivity 4 and Flow Temperature

In Examples 7-10 and Comparative Example 3, the composition solution was applied to a wafer substrate, on which an ARC29A film with a thickness of 77 nm (manufactured by Nissan Chemical Industries, Ltd.) had been formed, by spin coating and baked on a hot plate under the conditions shown in Table 2 to obtain a resist coating with a thickness of 200 nm. The coating was exposed to light through a mask pattern (a 6% half-tone mask) using a full field reduced projection exposure apparatus (S306C, manufactured by Nikon Corp., lens numerical aperture: 0.75). After performing PEB under the conditions shown in Table 2, the resist film was developed at 25° C. for 40 seconds in a 2.38 wt % tetramethylammonium hydroxide aqueous solution, washed with water, and dried to form a positive-tone resist pattern. The wafer was further post baked at 140-180° C. for 90 seconds. An optimum dose at which both hole patterns formed through mask patterns with a hole size of mask diameter of 120 nm and a mask pitch of 220 nm or 840 nm have a hole pattern diameter of 100 nm was taken as "sensitivity 4". The post bake temperature in this instance was regarded as an optimum reflow temperature and the optimum reflow temperature was taken as "flow temperature".

(7) Flow Rate 1 and Flow Rate 2

In Examples 7-10 and Comparative Example 3, the hole pattern diameters at a sensitivity 4 at ±10° C. of the flow temperature were determined to calculate the flow rate according to the following formula.

$$\text{Flow rate (nm/° C.)} = (A-B)/20° \text{ C.}$$

wherein A is a hole pattern size (nm) at a temperature 10° C. higher than the flow temperature and B is a hole pattern size (nm) at a temperature 10° C. lower than the flow temperature.

The flow rate at a pitch of 220 nm was taken as "flow rate 1" and the flow rate at a pitch of 840 nm was taken as "flow rate 2".

(8) Radiation Transmittance

In Examples 4-6 and Comparative Example 2, the composition solution was applied to a quartz glass plate by spin coating and the coating was pre-baked on a hot plate at temperature conditions shown in Table 2 to obtain a resist film with a thickness of 340 nm. Radiation transmittance of the resist film was calculated from absorbance at a wavelength of 193 nm and was adopted as a standard for transparency in the deep UV ray region.

(9) PEB Temperature Dependency 1

In Examples 4-6 and Comparative Example 2, when a line-and-space with a width of 160 nm was resolved under the temperature conditions shown in Table 2 and at the sensitivity 1, the average line width fluctuation when the PEB temperature shown in Table 2 was increased or decreased ±2° C. was taken as D1. In this instance, the PEB temperature dependency was regarded as "Bad" when D1 was 10 nm/° C. or more, and as "Good" when D1 was less than 10 nm/° C.

(10) PEB Temperature Dependency 2

In Examples 7-10 and Comparative Example 3, when a hole pattern with a diameter of 120 nm was formed under the temperature conditions shown in Table 2 and at the sensitivity 3, the average line width fluctuation when the PEB temperature shown in Table 2 was increased or decreased ±2° C. was taken as D2. In this instance, the PEB temperature dependency was regarded as "Bad" when D2 was 10 nm/° C. or more, and as "Good" when D2 was less than 10 nm/° C.

INDUSTRIAL APPLICABILITY

The radiation-sensitive resin composition comprising the acrylic copolymer of the present exhibits extremely high

TABLE 1

|  | Example | | | | | | | Comparative Example | |
|---|---|---|---|---|---|---|---|---|---|
|  | 4 | 5 | 6 | 7 | 8 | 9 | 10 | 2 | 3 |
| Resin | | | | | | | | | |
| A-1 | 100 | — | — | 100 | 100 | — | — | — | — |
| A-2 | — | 100 | — | — | — | 100 | — | — | — |
| A-3 | — | — | 100 | — | — | — | 100 | — | — |
| A-4 | — | — | — | — | — | — | — | 100 | 100 |
| Acid generator | | | | | | | | | |
| B-1 | 2 | 2 | 2 | 2.5 | 1.25 | 2.5 | 2.5 | 2 | 2 |
| B-2 | — | — | — | — | 1.195 | — | — | — | — |
| Acid diffusion controller | | | | | | | | | |
| C-1 | 0.3 | 0.3 | 0.3 | — | — | — | — | 0.3 | 0.25 |
| C-2 | — | — | — | 0.181 | 0.242 | 0.181 | 0.25 | — | — |
| C-3 | — | — | — | 0.055 | — | 0.055 | — | — | — |
| Solvent | | | | | | | | | |
| D-1 | 600 | 600 | 600 | 850 | 850 | 850 | 850 | 450 | 650 |
| D-2 | — | — | — | — | — | — | — | 150 | 230 |
| D-3 | — | — | — | 30 | 30 | 30 | 30 | — | — | values indicate parts by weight

TABLE 2

|  | Example | | | | | | | Comparative Example | |
|---|---|---|---|---|---|---|---|---|---|
|  | 4 | 5 | 6 | 7 | 8 | 9 | 10 | 2 | 3 |
| Film-producing condition | | | | | | | | | |
| Film thickness (nm) | 340 | 340 | 340 | 200 | 200 | 200 | 200 | 340 | 200 |
| PB | | | | | | | | | |
| Temperature (° C.) | 100 | 100 | 100 | 130 | 130 | 130 | 130 | 130 | 130 |
| Time (second) | 90 | 90 | 90 | 90 | 90 | 90 | 90 | 90 | 90 |
| PEB | | | | | | | | | |
| Temperature (° C.) | 100 | 100 | 100 | 110 | 110 | 110 | 110 | 130 | 130 |
| Time (second) | 90 | 90 | 90 | 90 | 90 | 90 | 90 | 90 | 90 |
| Property evaluation | | | | | | | | | |
| Transmittance (%) | 70 | 69 | 70 | — | — | — | — | 69 | — |
| Sensitivity 1 (J/m$^2$) | 243 | 253 | 248 | — | — | — | — | 292 | — |
| Sensitivity 2 (J/m$^2$) | 452 | 472 | 460 | — | — | — | — | 522 | — |
| Resolution 1 (nm) | 140 | 140 | 140 | — | — | — | — | 150 | — |
| Resolution 2 (nm) | 150 | 150 | 160 | — | — | — | — | 160 | — |
| Sensitivity 3 (J/m$^2$) | — | — | — | 384 | 372 | 381 | 321 | — | No resolution |
| Sensitivity 4 (J/m$^2$) | — | — | — | 430 | 473 | 429 | 403 | — | No flow |
| Flow temperature (° C.) | — | — | — | 174 | 174 | 175 | 163 | — | No flow |
| Flow rate 1 (nm/° C.) | — | — | — | −6.15 | −6.17 | −6.1 | −5.23 | — | No flow |
| Flow rate 2 (nm/° C.) | — | — | — | −6.35 | −6.39 | −6.36 | −5.93 | — | No flow |
| PEB temperature dependency 1 | Good | Good | Good | — | — | — | — | — | — |
| PEB temperature dependency 2 | — | — | — | Good | Good | Good | Good | Bad | Bad | etching resistance and etching surface roughness resistance and, can adjust the contact hole size during post baking, and can reduce the line width fluctuation due to post baking temperature variations. The resin composition is an ideal material in the manufacture of semiconductor devices which are expected to become more and more miniaturized in the future.

The invention claimed is:
1. An acrylic copolymer comprising:
a recurring unit of the following formula (1),

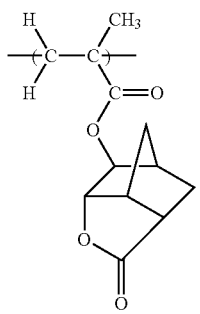

(1)

a recurring unit of the following formula (2),

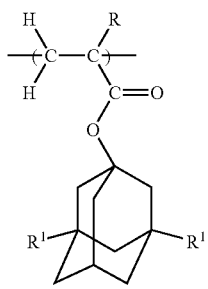

(2)

wherein R represents a hydrogen atom or a methyl group; $R^1$ individually represents a hydrogen atom, hydroxyl group, or —$COOR^3$ group, wherein $R^3$ is a hydrogen atom, a linear or branched alkyl group having 1-4 carbon atoms or an alicyclic alkyl group having 3-20 carbon atoms, provided that at least one of $R^1$ groups is not a hydrogen atom, and
a recurring unit of the following formula (3),

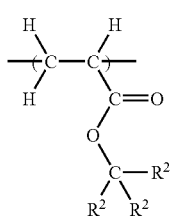

(3)

wherein any two of $R^2$ groups form, in combination and together with the carbon atom to which the two $R^2$ groups bond, a divalent alicyclic hydrocarbon group having 4-20 carbon atoms or a derivative thereof, with the remaining $R^2$ being a linear or branched alkyl group having 1-4 carbon atoms, a monovalent alicyclic hydrocarbon group having 4-20 carbon atoms, or a derivative thereof.

2. A radiation-sensitive resin composition comprising an acid-labile group-containing resin which is insoluble or scarcely soluble in alkali, but becomes alkali soluble by the action of an acid, and a photoacid generator, wherein the acid-labile group-containing resin is the acrylic copolymer according to claim 1.

3. The radiation-sensitive resin composition according to claim 2, wherein at least one $R^1$ group in the formula (2) is a hydroxyl group.

4. The radiation-sensitive resin composition according to claim 2, wherein the group —$C(R^2)_3$ in the formula (3) is at least one group selected from the group consisting of a 1-methyl-1-cyclopentyl group, a 1-ethyl-1-cyclopenthyl group, a 1-methyl-1-cyclohexyl group, and a 1-ethyl-1-cyclohexyl group.

5. The radiation-sensitive resin composition according to claim 2, wherein the acid-labile group-containing resin comprises the recurring unit (1), recurring unit (2), and recurring unit (3) at a molar ratio (mol % of the total recurring units) of 20-70:5-40:20-50.

6. The radiation-sensitive resin composition according to claim 2, wherein the photoacid generator comprises at least one compound selected from the group consisting of a triphenylsulfonium salt compound, a 4-cyclohexylphenyldiphenylsulfonium salt compound, a 4-t-butylphenyldiphenylsulfonium salt compound, and a tri(4-t-butylphenyl)sulfonium salt compound.

7. The radiation-sensitive resin composition according to claim 2, wherein the amount of photoacid generator is 0.1-7 parts by weight for 100 parts by weight of the acrylic copolymer.

8. The radiation-sensitive resin composition according to claim 2, further comprising an acid diffusion controller, wherein the acid diffusion controller is a nitrogen-containing organic compound.

9. The radiation-sensitive resin composition according to claim 2, wherein after post exposure baking the size of contact hole patterns is reduced at an excellent precision by post development baking.

10. The radiation-sensitive resin composition according to claim 2, wherein any two of $R^2$ groups in the formula (3) of the acid-labile group-containing resin form, in combination and together with the carbon atom to which these $R^2$ groups bond, a divalent monocyclic alicyclic hydrocarbon group having 4-20 carbon atoms or a derivative thereof, with the remaining $R^2$ group being a linear or branched alkyl group having 1-4 carbon atoms, a monovalent alicyclic hydrocarbon group having 4-20 carbon atoms, or a derivative thereof.

11. The radiation-sensitive resin composition according to claim 10, wherein the divalent monocyclic alicyclic hydrocarbon group having 4-20 carbon atoms is a cycloheptyl group or a cyclohexyl group.

12. An acrylic copolymer consisting essentially of: a recurring unit of the following formula (1),

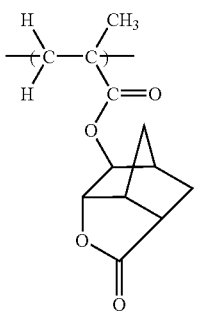

a recurring unit of the following formula (2),

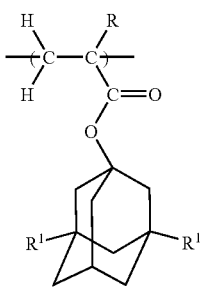

wherein R represents a hydrogen atom or a methyl group; $R^1$ individually represents a hydrogen atom, hydroxyl group, or —$COOR^3$ group, wherein $R^3$ is a hydrogen atom, a linear or branched alkyl group having 1-4 carbon atoms, or an alicyclic alkyl group having 3-20 carbon atoms, provided that at least one of $R^1$ groups is not a hydrogen atom, and a recurring unit of the following formula (3),

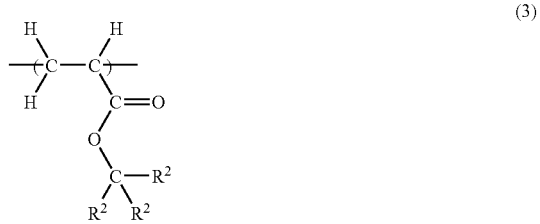

wherein any two of $R^2$ groups form, in combination and together with the carbon atom to which the two $R^2$ groups bond, a divalent alicyclic hydrocarbon group having 4-20 carbon atoms or a derivative thereof, with the remaining $R^2$ being a linear or branched alkyl group having 1-4 carbon atoms, a monovalent alicyclic hydrocarbon group having 4-20 carbon atoms, or a derivative thereof.

* * * * *